US012777759B2

(12) United States Patent
Hosokawa et al.

(10) Patent No.: US 12,777,759 B2
(45) Date of Patent: Oct. 27, 2026

(54) WIRING SUBSTRATE, LIGHT-EMITTING DEVICE, AND MANUFACTURING METHODS THEREOF

(71) Applicant: NICHIA CORPORATION, Anan (JP)

(72) Inventors: Atsushi Hosokawa, Tokushima (JP); Masaaki Katsumata, Anan (JP); Eiko Minato, Anan (JP)

(73) Assignee: NICHIA CORPORATION, Anan (JP)

( * ) Notice: Subject to any disclaimer, the term of this patent is extended or adjusted under 35 U.S.C. 154(b) by 371 days.

(21) Appl. No.: 18/389,775

(22) Filed: Dec. 20, 2023

(65) Prior Publication Data

US 2024/0213427 A1 Jun. 27, 2024

(30) Foreign Application Priority Data

Dec. 21, 2022 (JP) ................................ 2022-204787

(51) Int. Cl.

| | |
|---|---|
| ***H10H 20/857*** | (2025.01) |
| ***H10H 20/852*** | (2025.01) |
| ***H10H 20/856*** | (2025.01) |
| *H10H 20/01* | (2025.01) |
| *H10W 72/20* | (2026.01) |
| *H10W 90/00* | (2026.01) |

(52) U.S. Cl.

CPC ........ *H10H 20/857* (2025.01); *H10H 20/852* (2025.01); *H10H 20/856* (2025.01); *H10H 20/0362* (2025.01); *H10H 20/0363* (2025.01); *H10H 20/0364* (2025.01); *H10W 72/252* (2026.01); *H10W 90/724* (2026.01)

(58) Field of Classification Search

CPC .. H10H 20/857; H10H 20/852; H10H 20/856; H10H 20/0362

USPC ........................................................... 257/98

See application file for complete search history.

(56) References Cited

U.S. PATENT DOCUMENTS

2013/0186675 A1 7/2013 Takahashi et al.
2021/0305217 A1 9/2021 Abe et al.
2023/0041521 A1* 2/2023 Yamaguchi ............... G03F 7/40

FOREIGN PATENT DOCUMENTS

JP 2003-017832 1/2003
JP 2006-210514 8/2006
(Continued)

OTHER PUBLICATIONS

English translation of WO-2012090402-A1 (Year: 2012).*

*Primary Examiner* — Jami Valentine Miller
(74) *Attorney, Agent, or Firm* — MORI & WARD, LLP

(57) ABSTRACT

A wiring substrate including a base body provided with a via hole, a conductive portion disposed in the via hole, and a wiring portion electrically connected to the conductive portion and disposed on a surface of the body. The conductive portion includes a first conductive member containing copper particles and a resin. The first member contains small-sized particles with a particle size from 0.1 μm to 1.0 μm and large-sized particles with a particle size from more than 1.0 μm to 10 μm. The wiring portion includes a second conductive member containing copper particles. The second member contains small-sized particles with a particle size from 0.1 μm to 1.0 μm and large-sized particles with a particle size from more than 1.0 μm to 10 μm. A weight proportion of the small-sized particles in the first member is lower than a weight proportion of the small-sized particles in the second member.

10 Claims, 11 Drawing Sheets

(56) References Cited

FOREIGN PATENT DOCUMENTS

| | | | | |
|---|---|---|---|---|
| JP | 2013-153051 | | 8/2013 | |
| JP | 2014-127501 | | 7/2014 | |
| JP | 2015-065442 | | 4/2015 | |
| JP | 2016-025329 | | 2/2016 | |
| JP | 2017-183715 | | 10/2017 | |
| JP | 2021-097064 | | 6/2021 | |
| JP | 2021-163967 | | 10/2021 | |
| WO | WO-2012090402 | A1 * | 7/2012 | .......... H10W 70/685 |
| WO | WO2020/217358 | | 10/2020 | |

* cited by examiner

WIRING SUBSTRATE, LIGHT-EMITTING DEVICE, AND MANUFACTURING METHODS THEREOF

CROSS-REFERENCE TO RELATED APPLICATIONS

The present application claims priority under 35 U.S.C. § 119 to Japanese Patent Application No. 2022-204787, filed Dec. 21, 2022, the contents of which is hereby incorporated by reference in its entirety.

BACKGROUND

1. Technical Field

The present disclosure relates to a wiring substrate, a light-emitting device, and manufacturing methods of the wiring substrate and the light-emitting device.

2. Description of Related Art

A via filled with a conductive paste may be employed as an interlayer wiring of a multilayer wiring substrate. For example, Japanese Patent Publication No. 2006-210514 describes a double-sided wiring substrate provided with wirings made of copper foil on both surfaces of the substrate and provided with vias filled with conductive pastes as interlayer wirings.

SUMMARY

Embodiments of the present disclosure can provide a wiring substrate, a light-emitting device, and manufacturing methods of the wiring substrate and the light-emitting device with improved reliability.

A wiring substrate disclosed in an embodiment includes a base body provided with a via hole, a conductive portion disposed in the via hole, and a wiring portion electrically connected to the conductive portion and disposed on a surface of the base body. The conductive portion includes a first conductive member containing copper particles and a first resin, and the first conductive member contains small-sized particles with a particle size in a range from 0.1 μm to 1.0 μm and large-sized particles with a particle size in a range from more than 1.0 μm to 10 μm. The wiring portion includes a second conductive member containing copper particles, and the second conductive member contains small-sized particles with a particle size in a range from 0.1 μm to 1.0 μm and large-sized particles with a particle size in a range from more than 1.0 μm to 10 μm. A weight proportion of the small-sized particles in the first conductive member is lower than a weight proportion of the small-sized particles in the second conductive member.

A light-emitting device disclosed in an embodiment includes the wiring substrate described above, and a light-emitting element electrically connected to the wiring portion of the wiring substrate.

A manufacturing method of a wiring substrate disclosed in an embodiment includes preparing a base body provided with a via hole, a first conductive paste containing a first resin and copper particles including small-sized particles with a particle size in a range from 0.1 μm to 1.0 μm and large-sized particles with a particle size in a range from more than 1.0 μm to 10 μm, and a second conductive paste containing copper particles including small-sized particles with a particle size in a range from 0.1 μm to 1.0 μm and large-sized particles with a particle size in a range from more than 1.0 μm to 10 μm; filling an inside of the via hole with the first conductive paste and drying the first conductive paste; disposing the second conductive paste on the first conductive paste and on the base body and drying the second conductive paste; and pressurizing and firing the second conductive paste. In the preparing, a weight proportion of the small-sized particles in the first conductive paste is lower than a weight proportion of the small-sized particles in the second conductive paste.

A manufacturing method of a light-emitting device disclosed in an embodiment includes preparing a wiring substrate by the manufacturing method of a wiring substrate described above, disposing a light-emitting element over a wiring portion of the wiring substrate, and disposing a light-reflecting member spaced apart from a lateral surface of the light-emitting element.

According to the embodiments of the present disclosure, the wiring substrate, the light-emitting device, and the manufacturing methods of the wiring substrate and the light-emitting device with improved reliability can be provided.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Description of Embodiments

Figure 1:
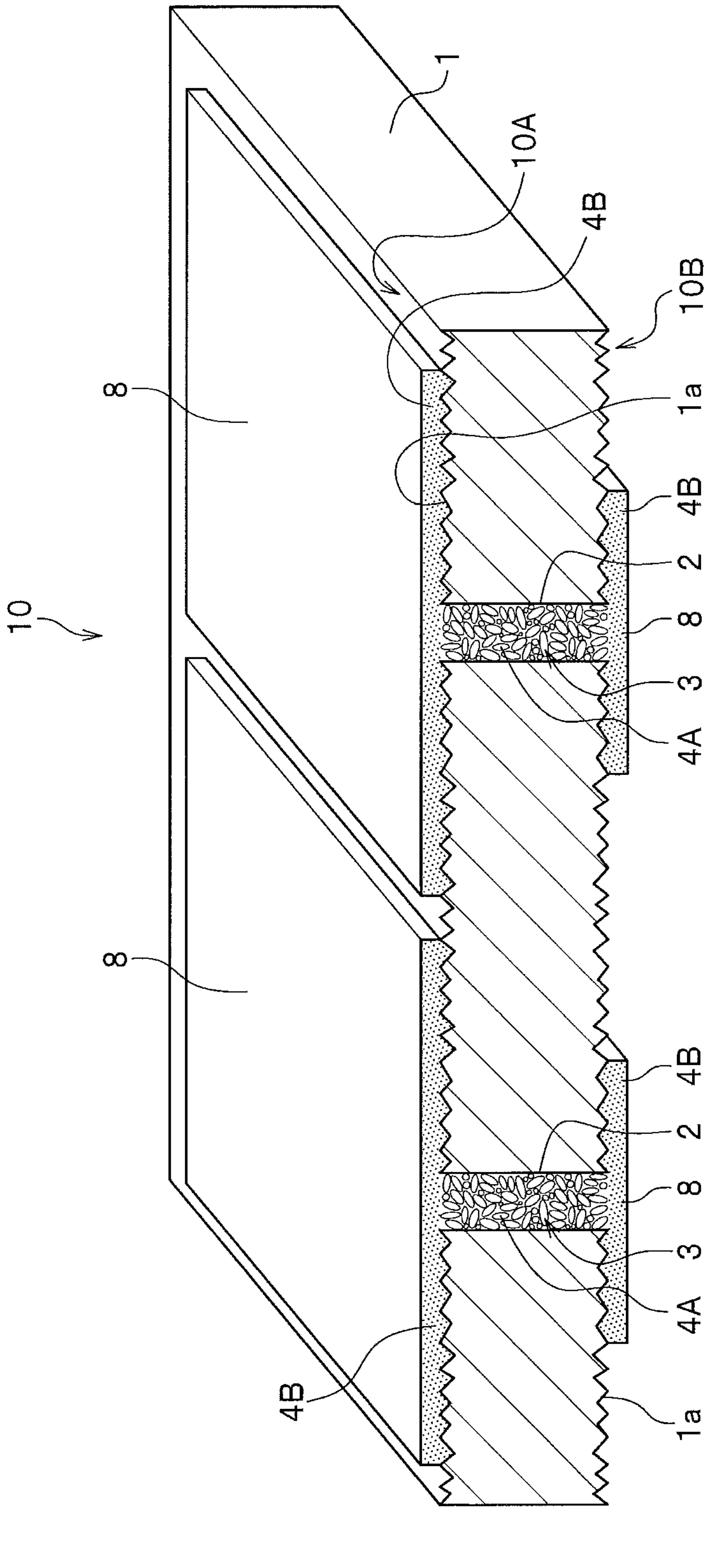
FIG. 1 is a cross-sectional perspective view exemplifying a wiring substrate according to an embodiment.

Embodiments according to the present disclosure will be described below with reference to the drawings. However, the embodiments described below are merely intended to embody the technical concept according to the present disclosure, and the invention is not limited to the following description unless otherwise specified. The content described in one embodiment can also be applied to another embodiment or modified example. The drawings are diagrams that schematically illustrate the embodiments. In order to provide clarity in the description, scales, intervals, positional relationships, and the like of members may be exaggerated, or some of the members may be omitted in the drawings. Directions illustrated in the drawings indicate relative positions between constitution components and are not intended to indicate absolute positions. Members having the same names and reference signs, as a rule, represent the same members or members of the same quality, and detailed description thereof is omitted as appropriate. In the embodiments, "covering" includes not only a case of covering by direct contact but also a case of indirectly covering, for example, via another member.

Wiring Substrate

Figure 2:
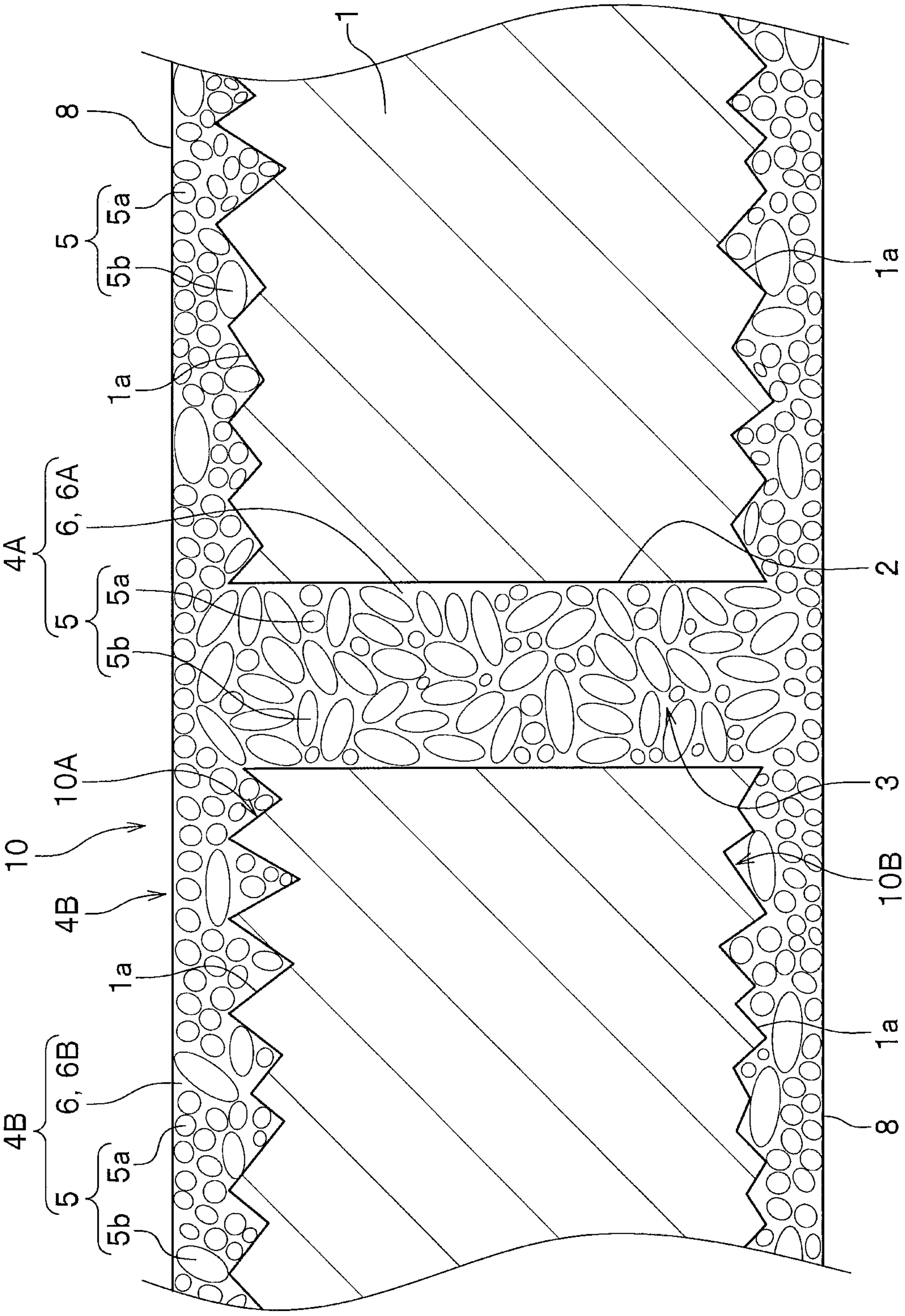
FIG. 2 is a partially enlarged cross-sectional view schematically illustrating an enlarged part of the wiring substrate according to the embodiment.

A wiring substrate 10 according to an embodiment will be described with reference to FIGS. 1 and 2. FIG. 1 is a cross-sectional perspective view exemplifying the wiring substrate according to the embodiment. FIG. 2 is a partially enlarged cross-sectional view schematically illustrating an enlarged part of the wiring substrate according to the embodiment.

The wiring substrate 10 includes a base body 1 provided with via holes 2, conductive portions 3 disposed in the via holes 2, and wiring portions 8 electrically connected to the conductive portions 3 and disposed on the surface of the base body 1. The conductive portion 3 includes a first conductive member 4A containing copper particles 5 and a first resin 6A. The first conductive member 4A contains small-sized particles 5*a* with a particle size in a range from 0.1 μm to 1.0 μm and large-sized particles 5*b* with a particle size in a range from more than 1.0 μm to 10 μm. Further, the wiring portion 8 includes a second conductive member 4B containing the copper particles 5. The second conductive member 4B contains the small-sized particles 5*a* with a particle size in a range from 0.1 μm to 1.0 μm and the large-sized particles 5*b* with a particle size in a range from more than 1.0 μm to 10 μm. The weight proportion of the small-sized particles 5*a* in the first conductive member 4A is lower than the weight proportion of the small-sized particles 5*a* in the second conductive member 4B. Each of the components of the wiring substrate 10 will be described below. Unless otherwise specified in the specification, a particle size refers to a median diameter (D50), a measurement method of a particle size distribution is a laser diffraction-scattering method, and MT3300II manufactured by MicrotracBEL Corp. or the like can be used as a particle size distribution measuring device.

The wiring substrate 10 includes the base body 1 having a first surface 10A and a second surface 10B opposite to the first surface 10A, the conductive portions 3 disposed in the via holes 2 penetrating from the first surface 10A to the second surface 10B of the base body 1, and the wiring portions 8 electrically connected to the conductive portions 3.

Base Body

The base body 1 is a plate-shaped or sheet-shaped member serving as a base of the wiring substrate 10. A shape of the base body 1 in a plan view is not limited, and, for example, a rectangular shape. The via holes 2 are formed at preset positions in the base body 1. The base body 1 is preferably at least one kind of glass epoxy resin, polyolefin resin, polyimide resin, aluminum nitride, or silicon nitride, for example. In addition, a surface 1*a* of the base body 1 is a rough surface, and preferably has a roughening degree Rz (maximum height roughness) of 1.0 μm or more. A surface roughness (Rzjis) of the base body 1 can be measured in accordance with JIS B 0601 using a stylus type surface roughness meter (for example, SE3500 manufactured by Kosaka Laboratory Ltd.) provided with a diamond stylus having a tip with a curvature radius r of 2 μm.

When the roughening degree Rz (maximum height roughness) of the surface 1*a* of the base body 1 is equal to 1.0 μm or more, connection strength between the base body 1 and the second conductive member 4B is improved as described later. The roughening degree Rz of the surface of the base body 1 is more preferably 2.0 μm or more, and further preferably 3.0 μm or more. The roughening degree Rz of the surface of the base body 1 is preferably 10.0 μm or less, particularly preferably 8.0 μm or less, and further preferably 6.0 μm or less. When the surface 1*a* of the base body 1 has the predetermined roughening degree described above, adhesiveness of the wiring portion 8 disposed on the base body 1 can be improved. That is, in the wiring portion 8, as described later, the second conductive member 4B contains the small-sized particles 5*a* such that the weight proportion of the small-sized particles 5*a* is higher than the weight proportion of the large-sized particles 5*b* in the copper particles 5. Therefore, in the second conductive member 4B of the wiring portion 8, the small-sized particles 5*a* enter the rough surface of the surface 1*a* of the base body 1, and thus conformability of the second conductive member 4B to protrusions and recessions of the rough surface of the base body 1 can be improved and the adhesiveness by an anchor effect can be improved.

Conductive Portion, Wiring Portion

The conductive portion 3 is a member that is disposed in the via hole 2 and can be electrically conductive. The conductive portion 3 is electrically connected to the wiring portion 8 disposed on the surface of the base body 1. The conductive portion 3 has conductivity and strength by being disposed in a paste form in the via hole 2 and fired. The conductive portion 3 includes the first conductive member 4A containing the copper particles 5 and the first resin 6A. The first conductive member 4A contains the small-sized particles 5*a* with a particle size in a range from 0.1 μm to 1.0 μm and the large-sized particles 5*b* with a particle size in a range from more than 1.0 μm to 10 μm in the copper particles 5. The weight proportion of the small-sized particles 5*a* in the first conductive member 4A is lower than the weight proportion of the small-sized particles 5*a* in the second conductive member 4B in which the wiring portion 8 contains the copper particles 5. Therefore, since the weight proportion of the large-sized particles 5*b* is higher in the conductive portion 3 than in the wiring portion 8, decreasing an amount of volumetric shrinkage during firing allows improvement of connection stability and reliability. In addition, heat conductivity of the conductive portion 3 is better than that of the wiring portion 8, and a heat dissipation property of the conductive portion 3 can be improved. In addition, smoothness of the surface of the wiring portion 8 can also be improved.

In the conductive portion 3, the weight proportion of the small-sized particles 5*a* to the small-sized particles 5*a* and the large-sized particles 5*b* of the copper particles 5 contained in the first conductive member 4A is preferably in a range from 30 wt. % to less than 70 wt. %, more preferably in a range from 35 wt. % to 65 wt. %, and further preferably in a range from 40 wt. % to 60 wt. %. It is assumed that the weight proportion of the small-sized particles 5*a* to the small-sized particles 5*a* and the large-sized particles 5*b* in the first conductive member 4A is lower than that in the second conductive member 4B. The weight proportion is set in the above-described range of the weight proportion under this assumption. In a region fitted to the conductive portion 3 up to the thicknesses of the parts of the wiring portions 8 where the conductive portion 3 is in contact with the wiring portions 8, the weight proportion of the large-sized particles 5*b* is higher than that of the small-sized particles 5*a* compared with the other regions of the wiring portions 8. Therefore, in the region, the amount of volumetric shrinkage can be reduced during firing.

In the conductive portion 3, the first conductive member 4A contains the first resin 6A, and the content of the first resin 6A is preferably in a range from 0.1 parts by mass to 2 parts by mass per 100 parts by mass of the copper particles 5 contained in the first conductive member 4A. In the conductive portion 3, when the content of the first resin 6A contained in the first conductive member 4A is in the range from 0.1 parts by mass to 2 parts by mass per 100 parts by mass of the copper particles 5, the reduction in the amount of volumetric shrinkage after firing is assisted. Since the first conductive member 4A contains the first resin 6A, when a first conductive paste is disposed in the via hole 2 before firing, the first conductive paste is easily handled compared with a configuration in which only powder is contained.

As examples of the first resin 6A as a resin binder with the copper particles 5, thermosetting resins, such as epoxy resin, silicone resin, phenol resin, polyimide resin, polyurethane resin, melamine resin, and urea resin, and thermoplastic resins, such as polyvinyl pyrrolidone resin, polyvinyl alcohol resin, polyethylene glycol resin, and polyamide resin, can be used. The first conductive member 4A preferably contains a reducing agent, such as organic acid. Thus, the copper particles 5 are easily bonded to one another, and the electric resistance can be reduced.

The wiring portions 8 are electrically connected to the conductive portion 3, and are disposed on the first surface 10A and the second surface 10B serving as the surfaces 1*a* of the base body 1. For example, the wiring portions 8 are disposed so as to be connected to the conductive portion 3 penetrating the base body 1 in a plate thickness direction, at the upper surface and the lower surface of the conductive portion 3. The wiring portion 8 is disposed having a rectangular shape in a plan view so as to be connected to and cover the conductive portion 3, for example. The wiring portion 8 includes the second conductive member 4B containing the copper particles 5. In the second conductive member 4B, the copper particles 5 include the small-sized particles 5*a* with a particle size in a range from 0.1 μm to 1.0 μm and the large-sized particles 5*b* with a particle size in a range from more than 1.0 μm to 10 μm. The second conductive member 4B containing only the copper particles 5 or containing the copper particles 5 in an organic solvent can be used, but here, as an example, the second conductive member 4B contains the copper particles 5 and a second resin 6B.

In the wiring portion 8, the second conductive member 4B contains the small-sized particles 5*a* of the copper particles 5 such that the weight proportion of the small-sized particles 5*a* is higher than that of the large-sized particles 5*b*. The second conductive member 4B preferably contains the small-sized particles 5*a* such that the weight proportion of the small-sized particles 5*a* to the small-sized particles 5*a* and the large-sized particles 5*b* of the copper particles 5 is preferably in a range from 70 wt. % to 95 wt. %. The weight proportion of the small-sized particles 5*a* to the small-sized particles 5*a* and the large-sized particles 5*b* of the copper particles 5 in the second conductive member 4B is more preferably 75 wt. % or more and further preferably 80 wt. % or more. It is assumed that the weight proportion of the small-sized particles 5*a* of the copper particles 5 in the second conductive member 4B is higher than the weight proportion of the small-sized particles 5*a* of the copper particles 5 in the first conductive member 4A. When the weight proportion of the small-sized particles 5*a* to the small-sized particles 5*a* and the large-sized particles 5*b* of the copper particles 5 in the second conductive member 4B is in the range, the small-sized particles 5*a* easily enter rough surface protrusions and recessions in a rough surface formed on the surface 1*a* of the base body 1, conformability to the rough surface protrusions and recessions can be improved, and adhesiveness by the anchor effect can be improved.

In the second conductive member 4B in the wiring portion 8, the content of the second resin 6B is preferably in a range from 0.25 parts by mass to 3 parts by mass per 100 parts by mass of the copper particles 5. As examples of the second resin 6B as a resin binder with the copper particles 5, thermosetting resins, such as epoxy resin, silicone resin, phenol resin, polyimide resin, polyurethane resin, melamine resin, and urea resin, and thermoplastic resins, such as polyvinyl pyrrolidone resin, polyvinyl alcohol resin, polyethylene glycol resin, and polyamide resin, can be used. The second conductive member 4B preferably contains a reducing agent, such as organic acid. This allows reduction in the electrical resistance in the connection with the copper particles 5. The second resin 6B can be made of the same material as that of the first resin 6A of the first conductive member 4A. Since the second conductive member 4B contains the second resin 6B, when a second conductive paste is disposed on the base body 1 before firing, the second conductive paste is easily handled compared with a configuration in which only powder is contained.

In the wiring portion 8 in contact with the conductive portion 3, the first conductive member 4A and the second conductive member 4B are continuous without an interface between the first conductive member 4A and the second conductive member 4B. The copper particles 5 and the first resin 6A or the second resin 6B are common main members in the first conductive member 4A and the second conductive member 4B. That is, the first conductive member 4A and the second conductive member 4B are distinguished from each other by making the weight proportions of the small-sized particles 5*a* and the large-sized particles 5*b* of the copper particles 5, which are main materials, different between the first conductive member 4A and the second conductive member 4B. Thus, the first conductive member 4A and the second conductive member 4B are integrated without forming an interface after firing.

In the wiring substrate 10 having the above-described configuration, since the conductive portion 3 disposed in the via hole 2 can be reduced in the amount of volumetric shrinkage after firing, stability of connection with a component to be electrically connected to the wiring substrate 10, such as a light-emitting element 20, can be ensured and reliability can be improved.

In addition, in the wiring substrate 10, when the weight proportions of the small-sized particles 5*a* and the large-sized particles 5*b* in the copper particles 5 common in the first conductive member 4A and the second conductive member 4B are different between the first conductive member 4A and the second conductive member 4B, the adhesiveness is improved by the anchor effect in the wiring portion 8 and the amount of volumetric shrinkage can be reduced in the conductive portion 3 to improve connection stability, in respective portions where the wiring portion 8 and the conductive portion 3 are deposited.

Manufacturing Method of Wiring Substrate

Figure 3:
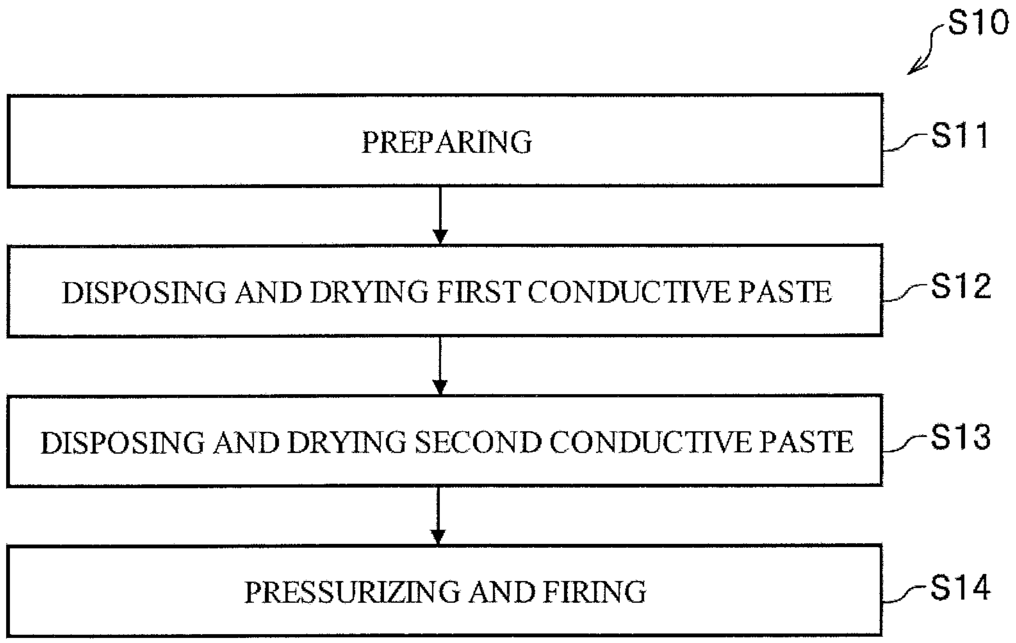
FIG. 3 is a flowchart exemplifying a manufacturing method of the wiring substrate according to the embodiment.
Figure 4A:
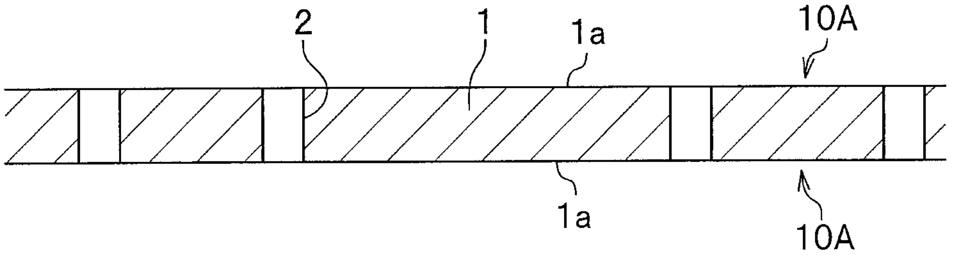
FIG. 4A is a cross-sectional view exemplifying the manufacturing method of the wiring substrate according to the embodiment.
Figure 4B:
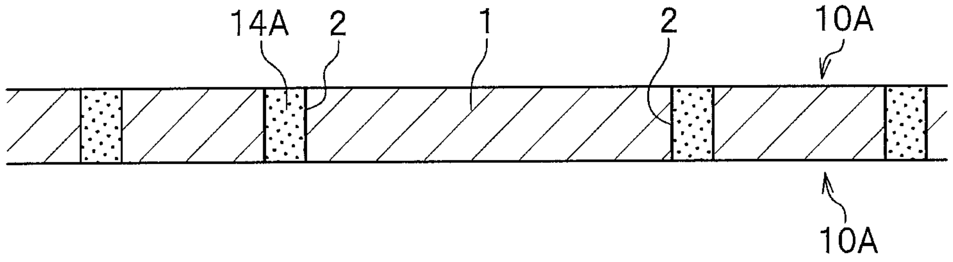
FIG. 4B is a cross-sectional view exemplifying the manufacturing method of the wiring substrate according to the embodiment.
Figure 4C:
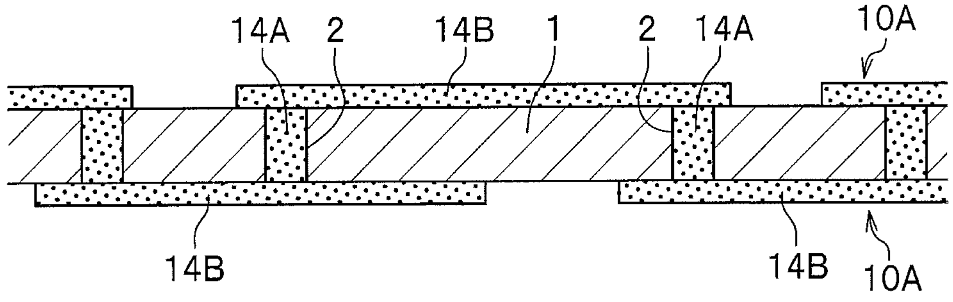
FIG. 4C is a cross-sectional view exemplifying the manufacturing method of the wiring substrate according to the embodiment.
Figure 4D:
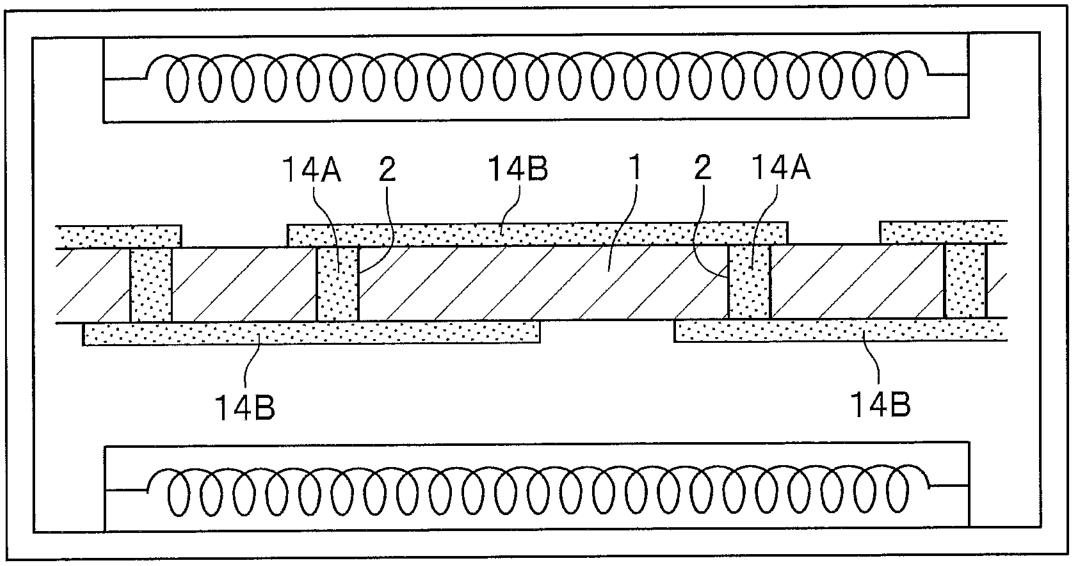
FIG. 4D is a cross-sectional view exemplifying the manufacturing method of the wiring substrate according to the embodiment.
Figure 4E:
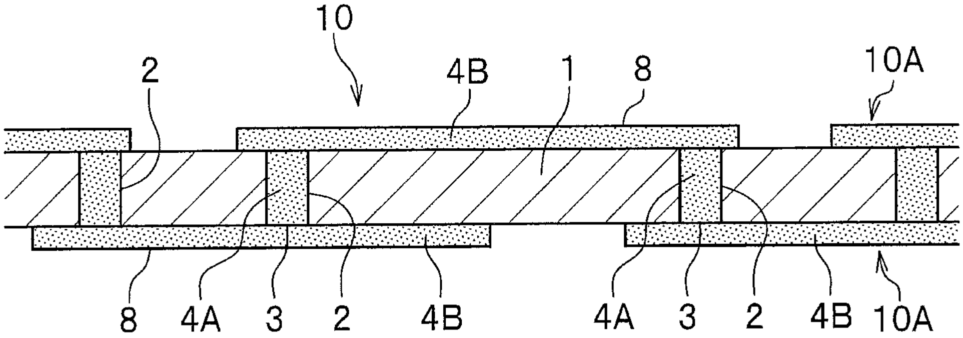
FIG. 4E is a cross-sectional view exemplifying the manufacturing method of the wiring substrate according to the embodiment.

Subsequently, a manufacturing method S10 of the wiring substrate according to the embodiment will be described with reference to FIGS. 3 to 4E. FIG. 3 is a flowchart of the manufacturing method S10 of the wiring substrate. FIGS. 4A to 4E are schematic cross-sectional views schematically illustrating the manufacturing method S10 of the wiring substrate.

The manufacturing method S10 of the wiring substrate includes: S11 of preparing the base body 1 provided with the via hole 2, the first conductive paste 14A containing the copper particles 5 including the small-sized particles 5*a* with a particle size in a range from 0.1 μm to 1.0 μm and the large-sized particles 5*b* with a particle size in a range from more than 1.0 μm to 10 μm and the first resin 6A, and the second conductive paste 14B containing the copper particles 5 including the small-sized particles 5*a* with a particle size in a range from 0.1 μm to 1.0 μm and the large-sized particles 5*b* with a particle size in a range from more than 1.0 μm to 10 μm; S12 of disposing the first conductive paste 14A in the via hole 2 and drying the first conductive paste 14A; S13 of disposing the second conductive paste 14B on the first conductive paste 14A and on the base body 1 and drying the second conductive paste 14B; and S14 of pressurizing and firing the second conductive paste 14B. In the preparing S11, the weight proportion of the small-sized particles 5*a* in the first conductive paste 14A is lower than the weight proportion of the small-sized particles 5*a* in the second conductive paste 14B.

Preparing Substrate

S11 of preparing the substrate is to prepare the base body 1 provided with the via hole, the first conductive paste 14A, and the second conductive paste 14B (hereinafter referred to as a step S11). In this step S11, the base body 1 preferably has the surface 1*a* being a rough surface. For example, a base body having a rough surface with a roughening degree Rz of 1.0 μm or more is prepared. The treatment of roughening the surface 1*a* of the base body 1 can be performed by a treatment method used in this field, for example, a physical treatment method, such as blasting, or a chemical treatment method. To form the via hole 2 in the base body 1, the via hole 2 can be formed by laser processing, chemical processing, such as etching, or mechanical processing, such as drilling.

In this step S11, the first conductive paste 14A contains the copper particles 5 including the small-sized particles 5*a* with a particle size in a range from 0.1 μm to 1.0 μm and the large-sized particles 5*b* with a particle size in a range from more than 1.0 μm to 10 μm. The first conductive paste 14A preferably contains the small-sized particles 5*a* such that the weight proportion of the small-sized particles 5*a* to the small-sized particles 5*a* and the large-sized particles 5*b* of the copper particles 5 is in a range from 30 wt. % to less than 70 wt. %. The weight proportion of the small-sized particles 5*a* in the copper particles 5 of the first conductive paste 14A is assumed to be lower than the weight proportion of the small-sized particles 5*a* in the copper particles 5 of the second conductive paste 14B, and the above-described weight proportions of the small-sized particles 5*a* and the large-sized particles 5*b* are set. In addition, in the step S11, the first conductive paste 14A preferably contains the first resin 6A. The first conductive paste 14A preferably contains the first resin 6A in a range from 0.1 parts by mass to 2 parts by mass per 100 parts by mass of the copper particles 5 contained in the first conductive paste 14A. Further, in the step S11, the first conductive paste 14A preferably contains an organic solvent, and the boiling point of the organic solvent is in a range from 100° C. to 300° C., and in particular, further preferably in a range from 150° C. to 300° C. In a case in which the first conductive member 4A contains an organic solvent, it has fluidity and is easily handled when disposed in the via hole 2.

In this step S11, the second conductive paste 14B contains the copper particles 5 including the small-sized particles 5*a* with a particle size in a range from 0.1 μm to 1.0 μm and the large-sized particles 5*b* with a particle size in a range from more than 1.0 μm to 10 μm. The second conductive paste 14B preferably contains the small-sized particles 5*a* such that the weight proportion of the small-sized particles 5*a* to the small-sized particles 5*a* and the large-sized particles 5*b* of the copper particles 5 is in a range from 70 wt. % to 95 wt. %. The weight proportion of the small-sized particles 5*a* in the copper particles 5 of the second conductive paste 14B is assumed to be higher than the weight proportion of the small-sized particles 5*a* in the copper particles 5 of the first conductive paste 14A, and the above-described weight proportions of the small-sized particles 5*a* and the large-sized particles 5*b* are set. In addition, in the step S11, the second conductive paste 14B preferably further contains the second resin 6B. The second conductive paste 14B preferably contains the second resin 6B in a range from 0.25 parts by mass to 3 parts by mass per 100 parts by mass of the copper particles 5 contained in the second conductive paste 14B. Further, in the step S11, the second conductive paste 14B preferably contains an organic solvent, and the boiling point of the organic solvent is in a range from 100° C. to 300° C., and in particular, further preferably in a range from 150° C. to 300° C. In a case in which the second conductive member 4B contains the organic solvent, it has fluidity and is easily handled when disposed in the base body 1.

Disposing and Drying First Conductive Paste

S12 of disposing and drying the first conductive paste (hereinafter referred to as a step S12) is to dispose the first conductive paste 14A in the via hole 2 of the base body 1 and dry the first conductive paste 14A. In the step S12, the first conductive paste 14A has fluidity before being dried. For example, the first conductive paste 14A can be injected into the via hole 2 from a nozzle of a dispenser or can be disposed such that the via hole 2 is filled therewith by screen printing or metal mask printing, or combination use of nozzle injection and screen printing, such as performing screen printing after nozzle injection, can be employed. In this step S12, the first conductive paste 14A is preferably dried at a temperature in a range from 60° C. to 100° C. In the step S12, when the first conductive paste 14A is dried, for example, an electric furnace can be used.

Disposing and Drying Second Conductive Paste

S13 of disposing and drying the second conductive paste (hereinafter referred to as a step S13) is to dispose the second conductive paste 14B on the first conductive paste 14A disposed in the via hole 2 and dried and on the base body 1 and dry the second conductive paste 14B. In this step S13, for example, the second conductive paste 14B can be disposed by application through a mask, or can be disposed by screen printing or metal mask printing. In this step S13, the second conductive paste 14B is preferably dried at a temperature in a range from 60° C. to 100° C. In the step S13, when the second conductive paste 14B is dried, for example, an electric furnace as illustrated in FIG. 4D can be used.

Pressurizing and Firing

Pressurizing and firing S14 is to pressurize and fire the second conductive paste 14B (hereinafter referred to as a step S14). In this step S14, the first conductive paste 14A and the second conductive paste 14B are preferably formed continuously. The first conductive paste 14A and the second conductive paste 14B disposed on the first conductive paste 14A and on the base body 1 can be pressurized at one time or a plurality of times. Instead of pressurizing the entire second conductive paste 14B at the same time, the second conductive paste 14B can be pressurized separately on the first conductive paste 14A and on the base body 1. In addition, since the copper particles 5, the first resin 6A, and the second resin 6B, which are mainly contained in the first conductive paste 14A and the second conductive paste 14B, are in common, the first conductive member 4A obtained by firing the first conductive paste 14A and the second conductive member 4B obtained by firing the second conductive paste 14B are continuously formed without forming an interface.

In addition, in the step S14, the firing is preferably performed in any of atmospheres selected from an air atmosphere, a vacuum atmosphere, and an inert gas atmosphere. When firing is performed in an air atmosphere or in an inert gas atmosphere, the pressure is preferably adjusted to be in a range from 2.0 MPa to 10.0 MPa by increasing the atmospheric pressure or pressing. When the step S14 is performed in a vacuum atmosphere, the step S14 can be performed by pressing in the above-described pressure range.

Further, in the step S14, the firing temperature is preferably in a range from 200° C. to 300° C. By setting the firing temperature to 300° C. or less in the step S14, the selection range of the organic solvent contained in the first conductive paste 14A and the second conductive paste 14B can be widened. In the case of performing firing after pressurization, an electric furnace, or a firing furnace or a press furnace used in the firing operation for this type of wiring substrate can be used.

According to the above-described procedure, in the manufacturing method S10 of the wiring substrate, the first conductive paste 14A and the second conductive paste 14B, which use the copper particles 5 and have different weight proportions of the small-sized particles 5*a* and the large-sized particles 5*b* of the copper particles 5 as described above, form the conductive portion 3 and the wiring portion 8, respectively. Therefore, in the conductive portion 3, the amount of volumetric shrinkage can be reduced to improve connection stability, and in the wiring portion 8, adhesiveness can be improved by the anchor effect.

Light-Emitting Device

Figure 5:
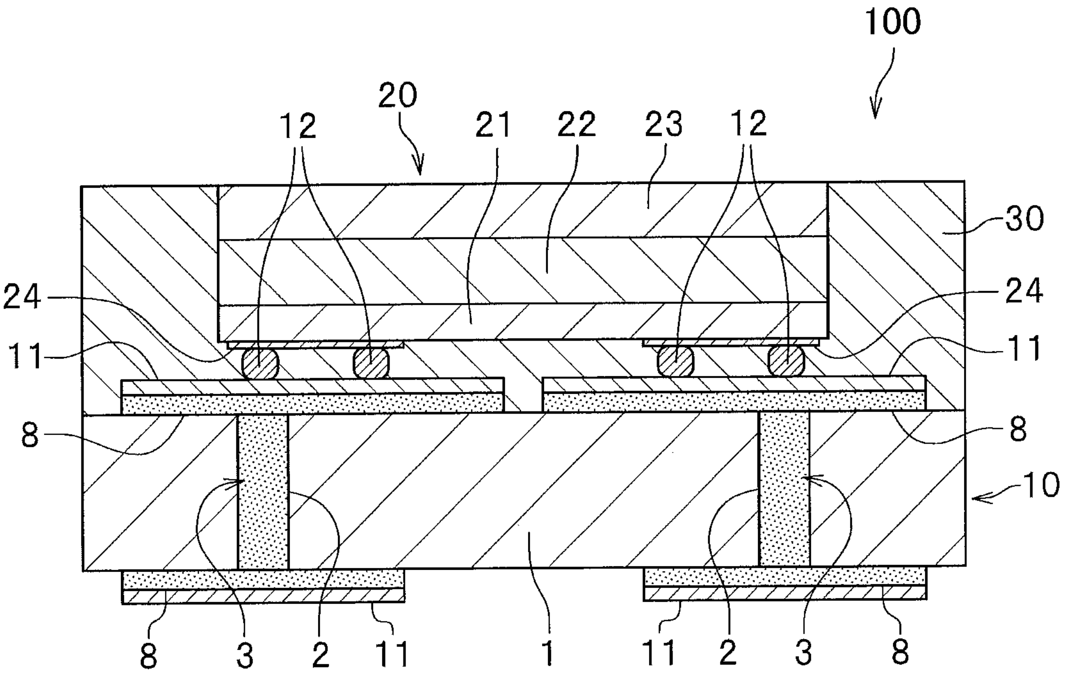
FIG. 5 is a cross-sectional view exemplifying a light-emitting device according to the embodiment.

Subsequently, a light-emitting device 100 according to the embodiment will be described with reference to FIG. 5. FIG. 5 is a cross-sectional view exemplifying the light-emitting device 100.

The light-emitting device 100 is a device configured to emit light by disposing the light-emitting element 20 over the wiring substrate 10. Although the number of the light-emitting elements 20 is one in the drawing, the number of the light-emitting elements 20 can be plural, and the arrangement of the light-emitting elements 20 is not particularly limited, for example, the light-emitting elements 20 being disposed in a line.

The light-emitting device 100 includes the wiring substrate 10 that has been already described above and the light-emitting element 20 electrically connected to the wiring portion 8 including the second conductive member 4B and included in the wiring substrate 10. In the light-emitting device 100, a light-reflecting member 30 is disposed on the lateral surfaces of the light-emitting element 20 and the upper surface of the wiring substrate 10, for example. In addition, in the wiring substrate 10, various patterns of wirings can be formed according to the application.

Light-Emitting Element

The light-emitting element 20 includes a semiconductor layered body 21, an element substrate 22, and a pair of element electrodes 24. The element substrate 22 is provided above the semiconductor layered body 21, and the pair of element electrodes 24 are provided below the semiconductor layered body 21. A light-transmissive member 23 is disposed above the element substrate 22 of the light-emitting element 20. The semiconductor layered body 21 can have any composition according to the desired emission wavelength. For example, a nitride semiconductor that can emit blue or green light ($In_XAl_YGa_{1-X-Y}N$, 0≤X, 0≤Y, X+Y≤1), GaP, GaAlAs or AlInGaP that can emit red light, or the like can be used. The size and shape of the light-emitting element 20 can be appropriately selected according to the purpose of use.

As an example, a sapphire substrate or a silicon substrate is used as the element substrate 22.

For example, the light-transmissive member 23 is made of an inorganic substance, such as a phosphor or glass, or a light-transmissive resin material, such as an epoxy resin, a silicone resin, a resin in which an epoxy resin and a silicone resin are mixed, or the like can be used. The light-transmissive member 23 can contain a phosphor in glass or resin, or can be obtained by firing a phosphor. When a phosphor that absorbs blue light from the light-emitting element 20 and emits green light, yellow light, orange light, red light, or the like is contained, for example, white light can be emitted. Furthermore, the light-transmissive member 23 can contain a plurality of types of phosphors. For example, when the light-transmissive member 23 contains a phosphor that absorbs blue light from the semiconductor layered body 21 and emits green light and a phosphor that emits red light, white light can be emitted from the light-emitting device 100.

Examples of the phosphor include an yttrium aluminum garnet-based phosphor ($Y_3(Al, Ga)_5O_{12}:Ce$, for example), a lutetium aluminum garnet-based phosphor ($Lu_3(Al, Ga)_5O_{12}:Ce$, for example), a terbium aluminum garnet-based phosphor ($Tb_3(Al, Ga)_5O_{12}:Ce$, for example), a β-SiALON phosphor ($(Si, Al)_3(O, N)_4:Eu$, for example), an α-SiAlON phosphor ($Mz(Si, Al)_{12}(O, N)_{16}$ (where 0<z≤2, and M is Li, Mg, Ca, Y, or a lanthanide element excluding La and Ce)), nitride phosphors, such as a CASN-based phosphor ($CaAlSiN_3$:Eu, for example) or an SCASN-based phosphor ((Sr, Ca)$AlSiN_3$:Eu, for example), fluoride phosphors, such as a KSF-based phosphor ($K_2SiF_6$:Mn, for example), a KSAF-based phosphor ($K_2$(Si, Al)$F_6$:Mn, for example), and an MGF-based phosphor (3.5 MgO·0.5 $MgF_2$·$GeO_2$:Mn, for example), quantum dot phosphors, such as perovskite and chalcopyrite, and the like.

The element electrodes 24 are connected to the wiring portions 8 of the wiring substrate 10 by metal bumps 12 via bonding members 11. One of the element electrodes 24 is a p-electrode and the other is an n-electrode, and the p-electrode is disposed at a distance from the n-electrode so as not to be electrically short-circuited. As an example, the element electrodes 24 have a configuration in which one p-electrode and one n-electrode are disposed, but can have a configuration in which one of the p-electrode and the n-electrode is disposed at two positions and the other is disposed at one position.

The metal bumps 12 electrically connect the element electrodes 24 and the wiring portions 8. All of the shape, size, and number of the metal bumps 12 can be appropriately set as long as they can be disposed within the ranges of the element electrodes 24. The size of the metal bump 12 can be appropriately adjusted according to the size of the semiconductor layered body, the required light emission output of the light-emitting element, and the like. For example, the metal bump 12 can have a diameter of about several tens of μm to several hundreds of μm.

The metal bumps 12 can be made of, for example, Au, Ag, Cu, Al, Sn, Pt, Zn, Ni, or an alloy thereof, and can be made of, for example, stud bumps known in the field. The stud bumps can be formed by a stud bump bonder, a wire bonding apparatus, or the like. The metal bumps 12 can be formed by a method known in the field, such as electrolytic plating, electroless plating, vapor deposition, sputtering, printing, or dispensing.

For example, here, the metal bumps 12 are bonded via the bonding members 11, such as plating layers. Examples of the bonding members 11 used here include solders, such as a Sn—Bi-based, Sn—Cu-based, Sn—Ag-based, and Au—Sn-based solders, eutectic alloys, such as an alloy containing Au and Sn as main components, an alloy containing Au and Si as main components, and an alloy containing Au and Ge as main components, paste materials, such as Au, Ag, and Pd, anisotropic conductive materials, such as ACP and ACF, a wax made from a low melting point metal, conductive adhesives combining these, and conductive composite adhesives.

Light-Reflecting Member

The light-reflecting member 30 is a member having light reflectivity. The light-reflecting member 30 is disposed so as to cover the upper surface of the wiring substrate 10 and the lateral surfaces of the light-emitting element 20. The light-reflecting member 30 is disposed so as to expose a light extraction surface of the light-emitting element 20 and so as to be flush with the light-transmissive member 23 of the light-emitting element 20. For example, the light-reflecting member 30 is also disposed between the lower surface of the light-emitting element 20 and the upper surface of the wiring substrate 10.

The light-reflecting member 30 preferably has a high reflectance in order that the light from the light-emitting element 20 can be efficiently used. The light-reflecting member 30 is preferably white. The reflectance of the light-reflecting member 30 is preferably, for example, 80% or more, and more preferably 90% or more, with respect to the wavelength of light emitted by the light-emitting element 20.

As the resin material of the light-reflecting member 30, a thermoplastic resin, such as acrylic resin, polycarbonate resin, cyclic polyolefin resin, polyethylene terephthalate resin, polyethylene naphthalate resin, or polyester resin, or a thermosetting resin, such as epoxy resin or silicone resin, can be used, for example. As a light-diffusing material, for example, a well-known material, such as titanium oxide, silicon oxide, aluminum oxide, zinc oxide, or glass, can be used.

When the light-emitting device 100 is connected to the outside, plating layers as the bonding members 11 are disposed as one example on the wiring portions 8 serving as the lower surface of the wiring substrate 10.

In the light-emitting device 100 having the above-described configuration, when the first conductive member 4A is provided in the conductive portion 3 of the wiring substrate 10, the amount of volumetric shrinkage of the first conductive member 4A is small, and reliability can be improved. This is because the light-emitting element 20 has good stability and is easily bonded by disposing the light-emitting element 20 over the wiring substrate 10 using the conductive portions 3 containing the first conductive members 4A having the small amount of volumetric shrinkage. In addition, adhesiveness between the base body 1 and the wiring portions 8 including the second conductive members 4B can be improved. This is because the second conductive member 4B contains the small-sized particles 5*a* at a higher weight proportion than that of the large-sized particles 5*b* of the copper particles 5, and therefore the second conductive member 4B can exhibit the anchor effect on the surface 1*a* of the base body 1. Furthermore, the surface of the second conductive member 4B can be smoothened.

Figure 8:
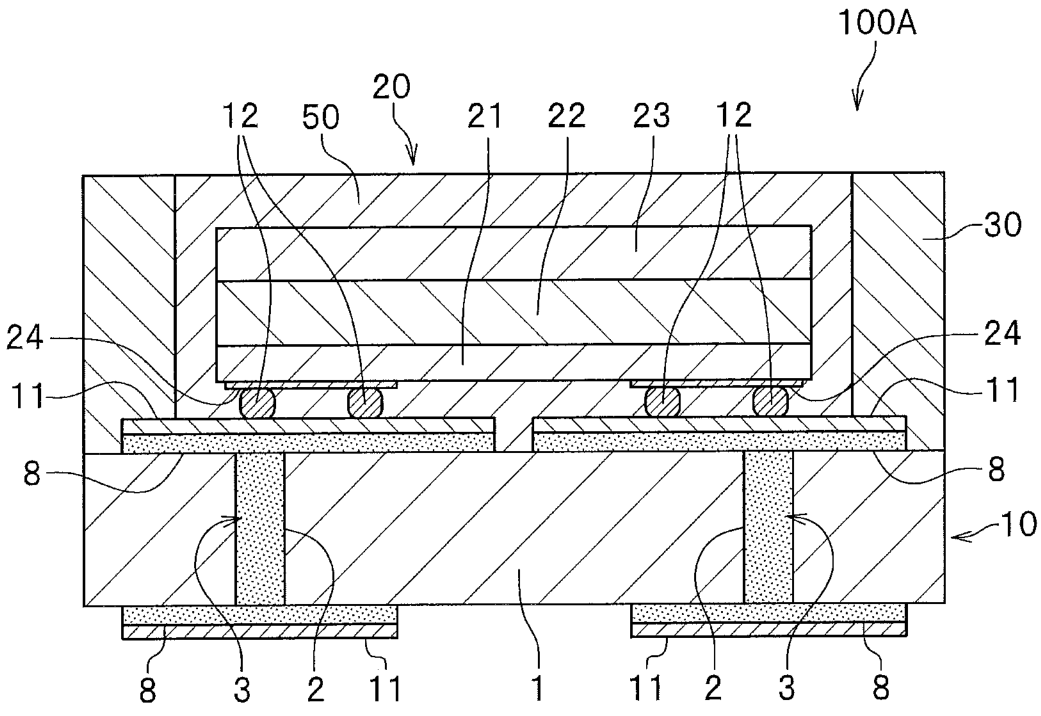
FIG. 8 is a cross-sectional view exemplifying an application example of the light-emitting device according to the embodiment.

Note that the light-emitting device can have a configuration as illustrated in FIG. 8. FIG. 8 is a cross-sectional view exemplifying an application example of the light-emitting device according to the embodiment. The same reference numerals are assigned to the components that have been already described above, and explanations thereof are omitted as appropriate.

A light-emitting device 100A includes the light-reflecting member 30 spaced apart from the lateral surfaces of the light-emitting element 20 and a sealing member 50 disposed between the light-reflecting member 30 and each of the lateral surfaces of the light-emitting element 20 so as to cover the upper surface of the light-emitting element 20. Here, the light-reflecting member 30 is disposed in a frame shape so as to be spaced apart from the light-emitting element 20.

The light-emitting device 100A includes the wiring substrate 10, the light-emitting element 20 electrically connected to the wiring portions 8 of the wiring substrate 10, the light-reflecting member 30 spaced apart from the lateral surfaces of the light-emitting element 20, and the sealing member 50 disposed between the light-reflecting member 30 and each of the lateral surfaces of the light-emitting element 20 so as to cover the upper surface of the light-emitting element 20.

Sealing Member

The sealing member 50 is a member disposed in a light-emitting region of the light-emitting device 100A. An upper surface of the sealing member 50 is a light-emitting surface of the light-emitting device 100A. The sealing member 50 is a member that covers and protects the light-emitting element 20.

The portion surrounded by the light-reflecting member 30 disposed in the frame shape is filled with the sealing member 50. A height of the sealing member 50 is not particularly limited. For example, an orientation angle can be increased by designing the sealing member 50 such that it has a height that is the same as or higher than the height of an upper end of the light-reflecting member 30 serving as a frame member. In the sealing member 50, a central portion can be higher than a peripheral edge portion, and the sealing member 50 can have a convex shape in a cross-sectional view. Thus, it is possible to increase the luminance when the light-emitting device 100 is viewed from above. On the other hand, designing the sealing member 50 such that it has a height lower than the height of the upper end of the light-reflecting member 30 serving as the frame member can make passage of light in the lateral direction difficult.

The sealing member 50 preferably has an insulating property and transmissivity, and is preferably excellent in weather resistance and light resistance. As the material of the sealing member 50, for example, silicone resin, epoxy resin, phenol resin, polycarbonate resin, or acrylic resin can be used. The sealing member 50 can contain a wavelength conversion substance or a light-diffusing material as a filler. Since the first conductive members 4A of the conductive portions 3 and the second conductive members 4B of the wiring portions 8 are also used in the light-emitting device 100A formed as described above, the operational effects similar to those of the light-emitting device 100 that has been already described above can be exhibited.

Manufacturing Method of Light-Emitting Device

Figure 6:
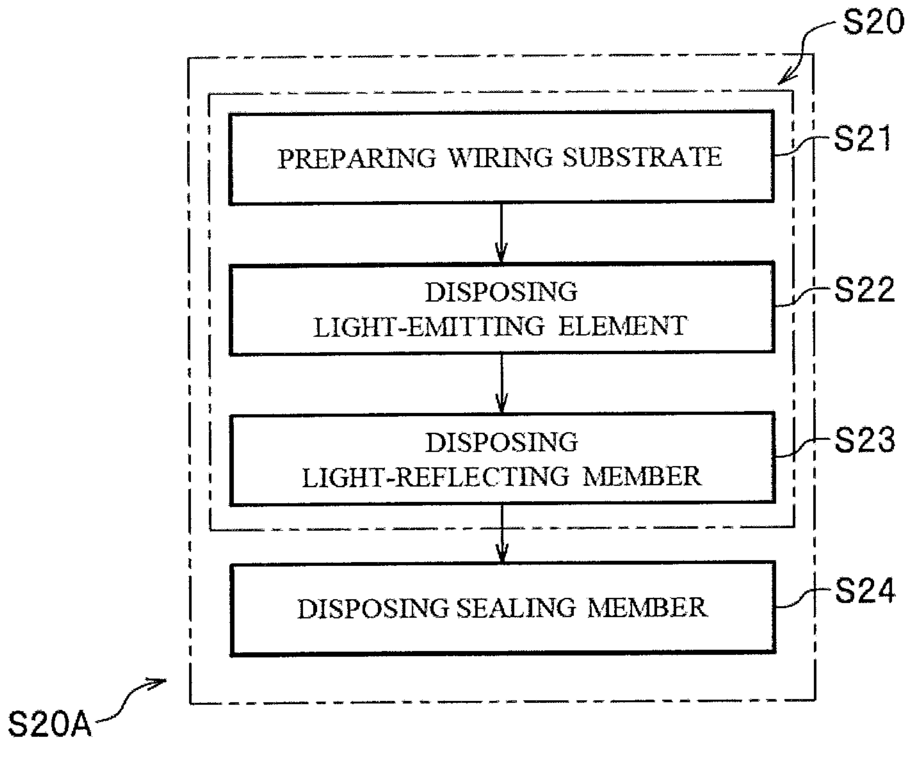
FIG. 6 is a flowchart exemplifying a manufacturing method of the light-emitting device according to the embodiment.
Figure 7A:
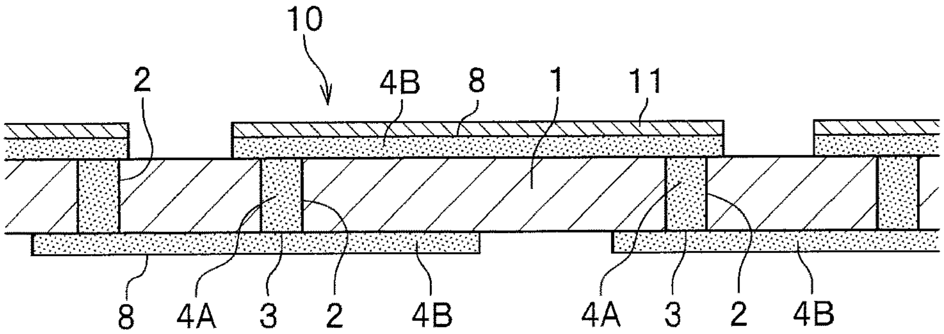
FIG. 7A is a cross-sectional view exemplifying the manufacturing method of the light-emitting device according to the embodiment.
Figure 7B:
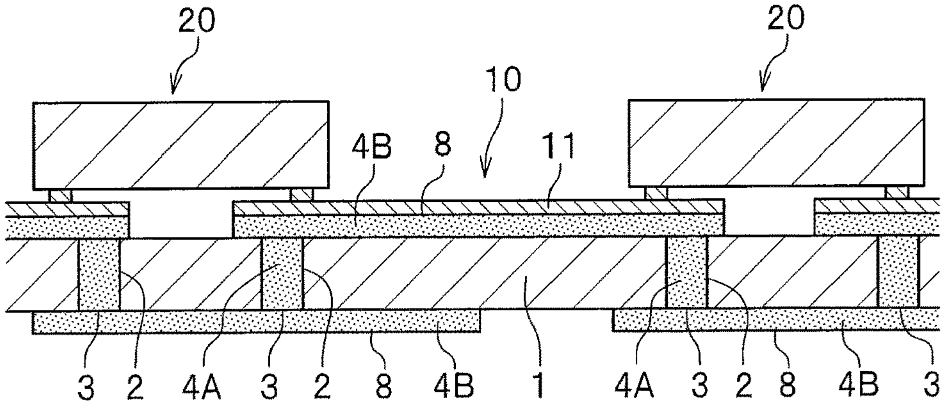
FIG. 7B is a cross-sectional view exemplifying the manufacturing method of the light-emitting device according to the embodiment.
Figure 7C:
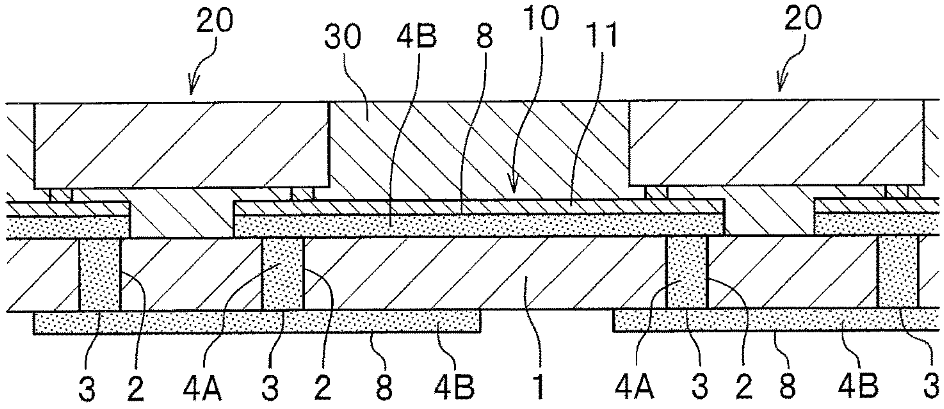
FIG. 7C is a cross-sectional view exemplifying the manufacturing method of the light-emitting device according to the embodiment.

Subsequently, the manufacturing method of the light-emitting device 100 according to the embodiment will be described with reference to FIGS. 6 to 7E. FIG. 6 is a flowchart exemplifying the manufacturing method of the light-emitting device according to the embodiment. FIGS. 7A to 7E are cross-sectional views exemplifying the manufacturing method of the light-emitting device according to the embodiment. The manufacturing method of the light-emitting device 100A will be described with reference to FIG. 6 after the description of the manufacturing method of the light-emitting device 100.

The manufacturing method S20 of the light-emitting device 100 includes S21 of preparing the wiring substrate 10 by the manufacturing method S10 of the wiring substrate that has already been described above, S22 of disposing the light-emitting elements 20 over the wiring portions of the wiring substrate 10, and S23 of disposing the light-reflecting member 30. In S23 of disposing the light-reflecting member 30, the light-reflecting member 30 is disposed in contact with the lateral surfaces and the lower surface of the light-emitting element 20. In S21 of disposing the light-emitting elements 20, since the wiring portions 8 including the second conductive members 4B are disposed on the upper and lower surfaces of the conductive portions 3 including the first conductive members 4A here, the conductive portions 3 including the first conductive members 4A and the light-emitting elements 20 are electrically connected via the wiring portions 8 including the second conductive members 4B.

Preparing Wiring Substrate

S21 of preparing the wiring substrate 10 (hereinafter referred to as a step S21) is to prepare the wiring substrate 10 manufactured by the manufacturing method S10 of the wiring substrate that has been already described above. In the wiring substrate 10, four wiring portions 8 including the second conductive members 4B are disposed on and connected to the conductive portions 3 including the first conductive members 4A disposed in two via holes 2 connecting the upper surface and the lower surface of the wiring substrate 10. The wiring portions 8 can be formed with the shape, size, and interval of the wiring portions 8 adjusted according to the element electrodes 24 of the light-emitting elements 20. The wiring substrate 10 can include a plurality of regions in which the light-emitting elements 20 are disposed, and can have a size large enough for singulation into the light-emitting devices 100 after the light-reflecting member 30 described later is disposed or a size for one light-emitting device 100. Also, here, the bonding members 11 are disposed on the surfaces of the second conductive members 4B of the wiring substrate 10.

Disposing Light-Emitting Element

S22 of disposing the light-emitting elements 20 (hereinafter referred to as a step S22) is to dispose the light-emitting elements 20 over the wiring substrate 10. In this step S22, the element electrodes 24 of the light-emitting elements 20 are connected to the wiring portions 8 using the metal bumps 12 via the bonding members 11 disposed on the second conductive member 4B. The light-emitting elements 20 in each of which the light-transmissive member 23 is connected to the element substrate 22 in advance are used. To bond the light-transmissive member 23 to the element substrate 22, a light-transmissive bonding material can be used, or the light-transmissive member 23 can be directly bonded to the element substrate 22 without using a bonding material.

Disposing Light-Reflecting Member

In S23 of disposing the light-reflecting member 30 (hereinafter referred to as a step S23), the light-reflecting member 30 can be disposed so as to cover the upper surface of the wiring substrate 10 and the lateral surfaces of the light-emitting elements 20. In this step S23, the light-reflecting member 30 is disposed on the wiring substrate 10 so as to surround each of the light-emitting elements 20 and expose the upper surfaces of the light-emitting elements 20 serving as the light extraction surfaces. The light-reflecting member 30 is disposed so as to have a rectangular shape with the light-emitting element 20 at the center in a plan view. In this step S23, the light-reflecting member 30 can be disposed by a known method, such as printing, injection-molding, spraying, or transfer-molding.

In the manufacturing method S20 of the light-emitting device, a singulation operation is performed as necessary after the operation of the step S23 is completed. For the light-emitting device 100, one unit of the light-emitting device 100 is set in advance by the number of the light-emitting elements 20 used. Therefore, when a plurality of the light-emitting devices 100 are manufactured at a time, the singulation operation is performed. When the singulation operation is performed, the plurality of light-emitting devices 100 are manufactured by performing cutting in a lattice pattern. For example, a rotation blade having a disk shape, an ultrasonic cutter, laser light irradiation, or the like can be used as a cutting method.

In the manufacturing method S20 of the light-emitting device according to the above-described procedure, bonding of the light-emitting elements 20 and the wiring portions 8 connected to the conductive portions 3 disposed in the via holes 2 of the wiring substrate 10 in the manufacturing method S10 of the wiring substrate is stabilized to achieve reliability, thus allowing stable on-off control or the like of the light-emitting elements 20.

Subsequently, the manufacturing method of the light-emitting device 100A as illustrated in FIG. 8 will be described with reference to FIG. 6. In a manufacturing method S20A of the light-emitting device 100A, the light-emitting element 20 can be covered with the sealing member 50.

The manufacturing method S20A of the light-emitting device 100A includes S21 of preparing the wiring substrate by the manufacturing method S10 of the wiring substrate, S22 of disposing the light-emitting element over the wiring portions of the wiring substrate, S23 of disposing the light-reflecting member spaced apart from the lateral surfaces of the light-emitting element, and S24 of disposing the sealing member covering the lateral surfaces of the light-emitting element and the upper surface of the light-emitting element. In S23 of disposing the light-reflecting member (hereinafter referred to as a step S23), the light-reflecting member 30 is spaced apart from the lateral surfaces of the light-emitting element 20, and a frame-shaped groove is formed between the light-emitting element 20 and the light-reflecting member 30.

In the step S23, unlike in the manufacturing method of the light-emitting device 100, the light-reflecting member 30 is spaced apart from the lateral surfaces of the light-emitting element. Here, since the light-emitting element 20 has a rectangular shape in a plan view, the light-reflecting member 30 is disposed such that a rectangular ring-shaped or rectangular frame-shaped space is formed from the lateral surfaces of the light-emitting element 20 to form a frame-shaped groove. In addition, in the step S23, the light-reflecting member 30 is disposed such that the upper surface of the light-reflecting member 30 spaced apart from the light-emitting element 20 is higher than the upper surface of the light-emitting element 20.

S24 of disposing the sealing member (hereinafter referred to as a step S24) is to dispose the sealing member 50 so as to cover the lateral surfaces of the light-emitting element 20 and the upper surface of the light-emitting element 20. In the step S24, the sealing member 50 can be disposed so as to cover the light-emitting element 20 by injecting a liquid or paste resin through an opening portion between the light-reflecting member 30 and the light-emitting element 20 and curing the resin. In this step S24, the sealing member 50 is disposed such that the upper surfaces of the sealing member 50 and the light-reflecting member 30 are at the same height.

In the conductive portion 3 and the wiring portion 8 of the wiring substrate 10, as already described above, the first conductive member 4A and the second conductive member 4B have the weight proportions of the small-sized particles 5*a* and the large-sized particles 5*b* of the copper particles 5 described above. Therefore, the bonding between the wiring portion 8 and the light-emitting element 20 is stabilized to achieve reliability, thus allowing stable control of the light-emitting element 20.

Surface Light-Emitting Device

Figure 9:
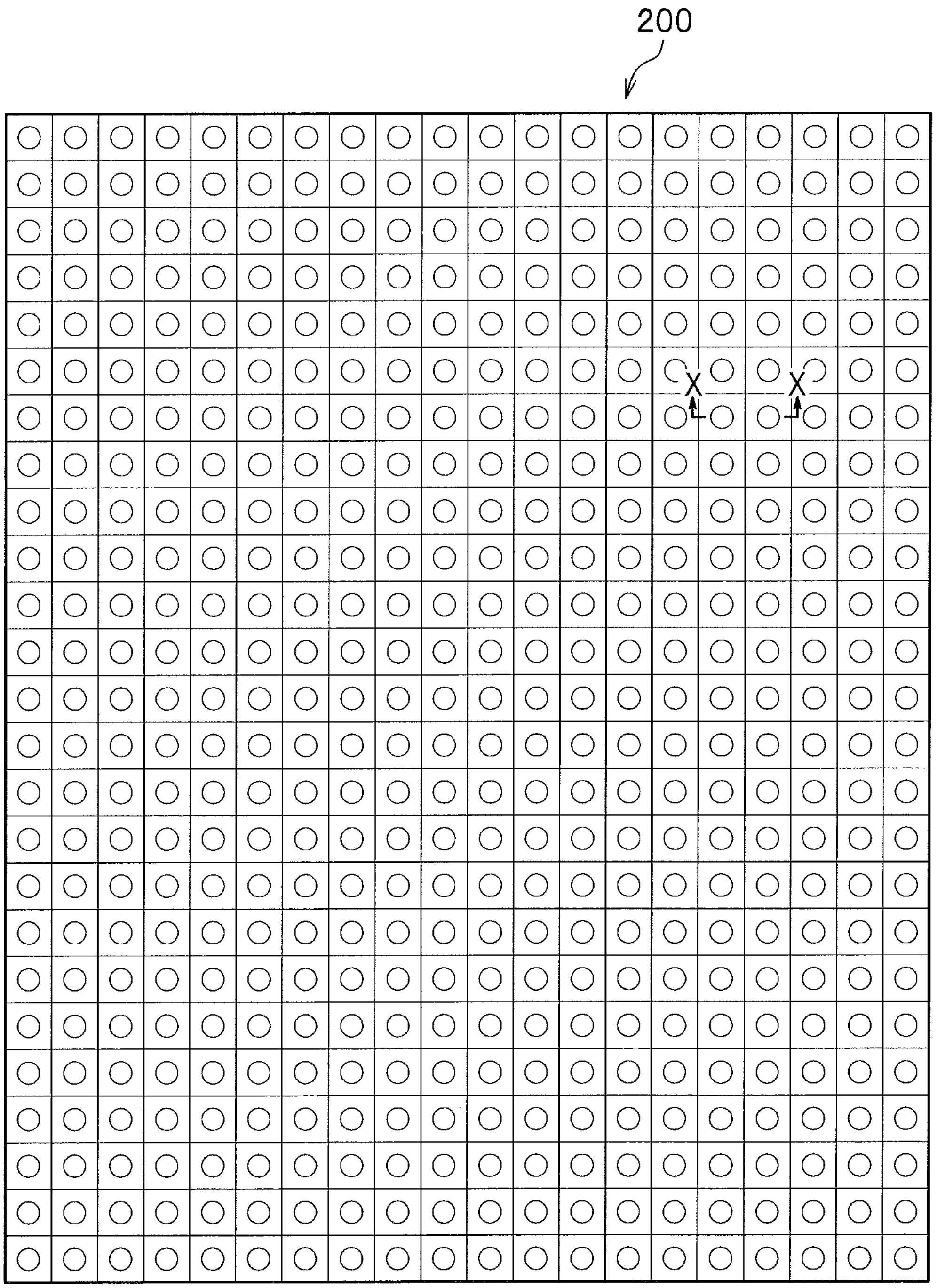
FIG. 9 is a plan view exemplifying an application example of the light-emitting device according to the embodiment.
Figure 10:
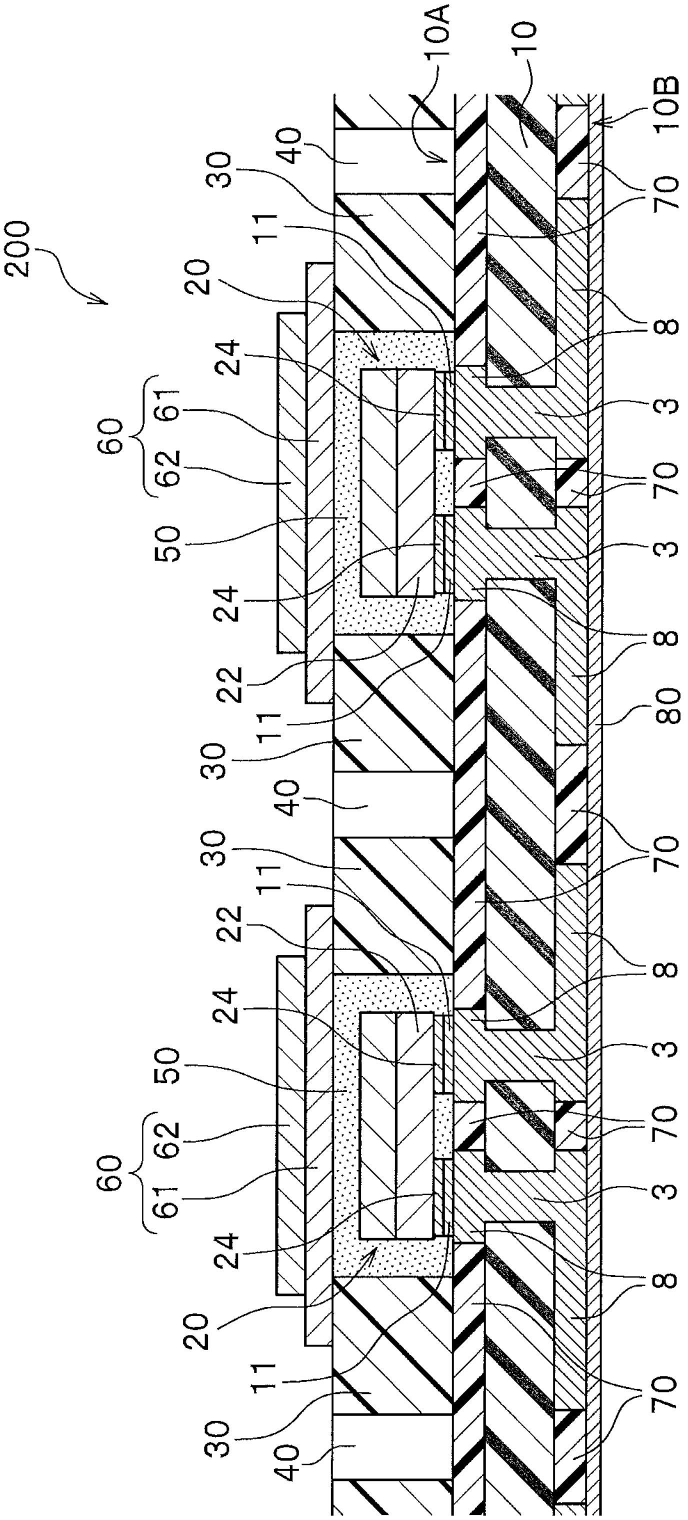
FIG. 10 is a cross-sectional view taken along a line X-X in FIG. 9.

Subsequently, as illustrated in FIGS. 9 and 10, the light-emitting device can have a configuration of a surface light-emitting device. FIG. 9 is a plan view exemplifying an application example of the light-emitting device according to the embodiment. FIG. 10 is a schematic cross-sectional view taken along line X-X in FIG. 9. The same reference numerals are assigned to the configurations that have been already described above, and explanations thereof are omitted.

In a surface light-emitting device 200, each of the light-emitting devices 100A is separated by a partition groove 40, which will be described later, in the continuous wiring substrate 10, and one light-emitting device 100A is a cell as a control unit of brightness and on/off. Although the light-emitting device 100A is described as an example in the surface light-emitting device 200, the light-emitting device 100 can be used instead of the light-emitting device 100A. The surface light-emitting device 200 includes the wiring substrate 10 that has been already described above and the light-emitting elements 20 disposed over the wiring substrate 10.

In the surface light-emitting device 200, on the first surface 10A serving as the upper surface and the second surface 10B serving as the lower surface of the wiring substrate 10, resist portions 70 serving as protective films are disposed in the substrate surface portions other than the wiring portions 8 as an example. Furthermore, a covering member 80 that covers the resist portions 70 and the wiring portions 8 is disposed on the second surface 10B of the wiring substrate 10. In addition, in the surface light-emitting device 200, light adjustment members 60 covering the upper surfaces of the sealing members 50 can be disposed. The light adjustment member 60 includes a first light adjustment portion 61 and a second light adjustment portion 62 located on the upper side of the first light adjustment portion 61, for example.

Light-Emitting Element

The light-emitting elements 20 are arranged in the row direction and the column direction over one surface of the wiring substrate 10. The light-emitting element 20 is covered with the sealing member 50. The light-reflecting member 30 is disposed in a rectangular frame shape on the outer surface of the sealing member 50. The light-reflecting member 30 is disposed with the partition groove 40 between the light-reflecting member 30 and the adjacent light-reflecting member 30. The partition groove 40 can be filled with a member having light reflectivity. The element electrodes 24 of the light-emitting element 20 are connected to the wiring portions 8 via the bonding members 11 facing the respective wiring portions 8.

The light-emitting element 20 can have the configuration described for the light-emitting device 100A or can have the configuration described for the light-emitting device 100. As an example, the light-emitting element 20 can include only the element substrate 22 and the semiconductor layered body 21 without including the light-transmissive member 23. The light-transmissive member 23 or the sealing member 50 can be disposed, and the light-transmissive member 23 and/or the sealing member 50 can contain a phosphor or the like. Furthermore, the light-emitting element 20 can be one in which only a phosphor or the like is disposed on the element substrate 22. In the surface light-emitting device 200, since the individual light-emitting devices 100A are arranged in the row direction and the column direction via the partition groove 40, the light-emitting elements 20 are also arranged in the row and column directions accordingly.

Wiring Substrate

The wiring substrate 10 is used in common in the plurality of light-emitting devices 100A disposed in the surface light-emitting device 200. The wiring substrate 10 has the configuration, which has been already described, including the conductive portions 3 disposed in the via holes 2 of the base body 1 and the wiring portions 8 connected to the conductive portions 3, and the resist portions 70 are disposed on the portions of the first surface 10A and the second surface 10B except for the wiring portions 8. As an example, the wiring substrate 10 is further provided with the covering member 80 disposed on the second surface 10B. The resist portions 70 are disposed on the first surface 10A and the second surface 10B of the wiring substrate 10 excluding the wiring portions 8, through a mask, by screen printing or the like. A material cured by exposure can be used for the resist portion 70. Further, the resist portion 70 can be a dry film type material. Note that the resist portion 70 need not necessarily be disposed on the first surface 10A or the second surface 10B of the wiring substrate 10. Furthermore, the covering member 80 disposed on the second surface 10B of the wiring substrate 10 is an insulating member. For example, a silicone resin, an epoxy resin, or the like can be used as the material of the covering member 80. In the wiring substrate 10, the covering member 80 can protect the lower surface of the wiring substrate 10.

Partition Groove

The partition groove 40 is a groove that separates and surrounds every predetermined number of light-emitting devices 100A. Here, the partition groove 40 is provided in a rectangular lattice shape, and separates and surrounds the light-emitting devices 100A one by one. The surface light-emitting device 200 can control brightness and on/off in units of sections surrounded by the partition groove 40. The partition groove 40 can be partially or entirely filled with a member having light reflectivity. The material of the member with which the partition groove 40 is filled can be, for example, a material in which a light-diffusing material, such as titanium oxide, silicon oxide, or aluminum oxide, is contained in a resin, such as acrylic, polycarbonate, silicone, or epoxy.

Sealing Member

The sealing member 50 is a member having transmissivity and disposed above and lateral to the light-emitting element 20. Here, the sealing member 50 is disposed so as to cover the laterals and the upper portion of the light-emitting element 20 on the inner side of the light-reflecting member 30 and is disposed in contact with the lower surface of the light-emitting element 20 and the upper surface of the resist portion 70. The material of the sealing member 50 is not limited as long as the material is a transparent resin. However, it is preferable to use a thermosetting resin, such as an epoxy resin, a silicone resin, or an acrylic resin.

Light Adjustment Member

The light adjustment member 60 includes the first light adjustment portion 61 and the second light adjustment portion 62. The first light adjustment portion 61 is disposed in contact with the upper surface of the sealing member 50 and the upper surface of the light-reflecting member 30. The first light adjustment portion 61 is a sheet-shaped or plate-shaped member, and is formed in a shape and a size that allow the upper surface of the sealing member 50 to be enclosed in a plan view. As an example, the first light adjustment portion 61 has a circular shape in a plan view. A material similar to that of the sealing member 50 can be used as the material of the first light adjustment portion 61. The first light adjustment portion 61, the second light adjustment portion 62, or the sealing member 50 can contain one kind of phosphor or a plurality of kinds of phosphors.

The second light adjustment portion 62 is a sheet-shaped or plate-shaped member that reflects, above the light-emitting element 20, a part of the light from the light-emitting element 20. The second light adjustment portion 62 is disposed above the light-emitting element 20. When the sealing member 50 and the first light adjustment portion 61 are provided, the second light adjustment portion 62 is disposed on the upper side of the sealing member 50 and the first light adjustment portion 61. The second light adjustment portion 62 is disposed so as to be enclosed by the upper surface of the first light adjustment portion 61, but can be disposed extending up to the upper surface of the light-reflecting member 30. The second light adjustment portion 62 is disposed at a position opposed to the light-emitting element 20 in a plan view, and is formed in a shape and a size that allow the light-emitting element 20 to be enclosed. Here, the second light adjustment portion 62 has a circular shape, but can have a rectangular shape or the like.

The light transmittances of the first light adjustment portion 61 and the second light adjustment portion 62 are preferably in a range from 20% to 60% and more preferably in a range from 30% to 40%, with respect to the light of the light-emitting element 20, for example. A material of the second light adjustment portion 62 can be, for example, a resin material containing a light-diffusing material, or a metal material. For example, the resin material can be a polyethylene terephthalate resin, a silicone resin, an epoxy resin, or a resin obtained by mixing these resins. Examples of the light-diffusing material include well-known materials such as titanium oxide, silicon oxide, aluminum oxide, zinc oxide, and glass. The second light adjustment portion 62 can internally contain bubbles, such as air.

In the surface light-emitting device 200, when the element electrodes 24 and the wiring portions 8 are connected, by including the first conductive member 4A in the conductive portion 3, the amount of volumetric shrinkage of the first conductive member 4A is small and reliability can be improved. In particular, in the surface light-emitting device 200 including a large number of the light-emitting elements, by disposing the light-emitting elements 20 over the wiring substrate 10 using the conductive portions 3 including the first conductive members 4A having the small amount of volumetric shrinkage, stability of the connection and on/off control of all the disposed light-emitting elements 20 becomes satisfactory. In the surface light-emitting device 200, the wiring portions 8 including the second conductive members 4B exhibit the anchor effect on the surface 1*a* of the base body 1, thereby improving the adhesiveness to the base body 1 and enhancing reliability.

The width of the partition groove 40 can be different between a lower end side and an upper end side. The lateral surface of the light-reflecting member 30 on the partition groove 40 can be inclined or need not be inclined. The partition groove 40 can be formed such that parts of the light-reflecting members 30 adjacent on the wiring substrate 10 side are continuous. The partition groove 40 can separate and surround a plurality of the light-emitting devices 100A. For example, the partition groove 40 can separate and surround every four light-emitting devices 100A disposed in two rows and two columns or every nine light-emitting devices 100A disposed in three rows and three columns. The light that is guided between adjacent sections can be adjusted by the depth and the shape of the partition groove 40.

Manufacturing Method of Surface Light-Emitting Device

Subsequently, the manufacturing method of the surface light-emitting device will be described.

The manufacturing method of the surface light-emitting device includes manufacturing and preparing the wiring substrate 10 by the manufacturing method S10 of the wiring substrate, disposing the light-emitting elements 20 over the wiring portions 8 in the wiring substrate 10, disposing the light-reflecting members 30 spaced apart from the lateral surfaces of the light-emitting elements 20, and disposing the sealing members 50 covering the lateral surfaces of the light-emitting elements 20 and the upper surfaces of the light-emitting element 20. The manufacturing method can include disposing the light adjustment members 60 above the sealing members 50 and above the light-reflecting members 30. In disposing the light-reflecting members 30, the light-reflecting members 30 are disposed such that the partition groove 40 is provided between the adjacent light-reflecting members 30.

Manufacturing and Preparing Wiring Substrate

Manufacturing and preparing the wiring substrate is to manufacture and prepare the wiring substrate 10 by the manufacturing method S10 of the wiring substrate. In the surface light-emitting device 200, since the plurality of light-emitting elements 20 are disposed over the wiring substrate 10, a plurality of the conductive portions 3 and a plurality of the wiring portions 8 for the light-emitting elements 20 disposed, via the partition groove 40, in the row and column directions are formed.

Disposing Light-Emitting Element

Disposing the light-emitting elements is to dispose the plurality of light-emitting elements 20 over the wiring substrate 10. In the manufacturing method of the surface light-emitting device, the element electrodes 24 of the light-emitting elements 20 are connected, via the bonding members 11, to the wiring portions 8 serving as the upper surface of the wiring substrate 10. As the conductive bonding member 11, for example, a bump formed of gold, silver, copper, or the like, a conductive paste of a mixture of a resin binder and powder of a metal, such as gold, silver, copper, platinum, or aluminum, a tin-silver-copper (SAC) solder, a tin-bismuth (SnBi) solder, or the like can be used. Here, the light-emitting elements 20 are disposed by solder reflow. The conductive bonding members 11 can be disposed in advance on the side of the pair of element electrodes 24 and bonded to the wiring portions 8.

Disposing Light-Reflecting Member

Disposing the light-reflecting member is to dispose the light-reflecting member 30 in a rectangular frame shape so as to be spaced apart from the lateral surfaces of the light-emitting element 20. The light-reflecting members 30 are disposed in the row and column directions such that the partition groove 40 is provided between the adjacent light-reflecting members 30.

Disposing Sealing Member

Disposing the sealing members is to dispose the sealing members 50 so as to cover the lateral surfaces of the light-emitting elements 20 and the upper surfaces of the light-emitting element 20. The sealing member 50 can be disposed so as to cover the light-emitting element 20 by injecting a liquid or paste resin through an opening portion between the light-reflecting member 30 and the light-emitting element 20 and curing the resin.

Disposing Light Adjustment Member

A manufacturing method S100A of the surface light-emitting device can include disposing the light adjustment member. Disposing the light adjustment member is to dispose the light adjustment members 60 at positions facing the light-emitting elements 20 on the upper surfaces of the sealing members 50 and the light-reflecting members 30 in a plan view. In disposing the light adjustment member, the light adjustment member 60 can be formed by applying a resin as a material on the sealing member 50 and the light-reflecting member 30 and curing the resin, or can be formed by disposing a film-shaped or plate-shaped member. Here, as an example, a silicone resin containing titanium oxide is disposed as the sheet-shaped first light adjustment portion 61 on the sealing member 50 and the light-reflecting member 30, and then the sheet-shaped second light adjustment portion 62 having an area smaller than that of the first light adjustment portion 61 is disposed.

In the manufacturing method S100A of the surface light-emitting device having the above-described configuration, since the wiring substrate 10 manufactured by the manufacturing method S10 of the wiring substrate is used, the amount of volumetric shrinkage of the conductive portion 3 of the wiring substrate 10 is suppressed, and the anchor effect of the wiring portion 8 with the base body 1 can be enhanced. As a result, the reliability of the surface light-emitting device 200 can be enhanced. In addition, in the manufacturing method S100A of the surface light-emitting device, by providing the light adjustment members 60, light directly above the light-emitting elements 20 in the light extraction surface of the surface light-emitting device 200 can be weakened, and the luminance of the light extraction surface can be close to uniform.

Figure 11:
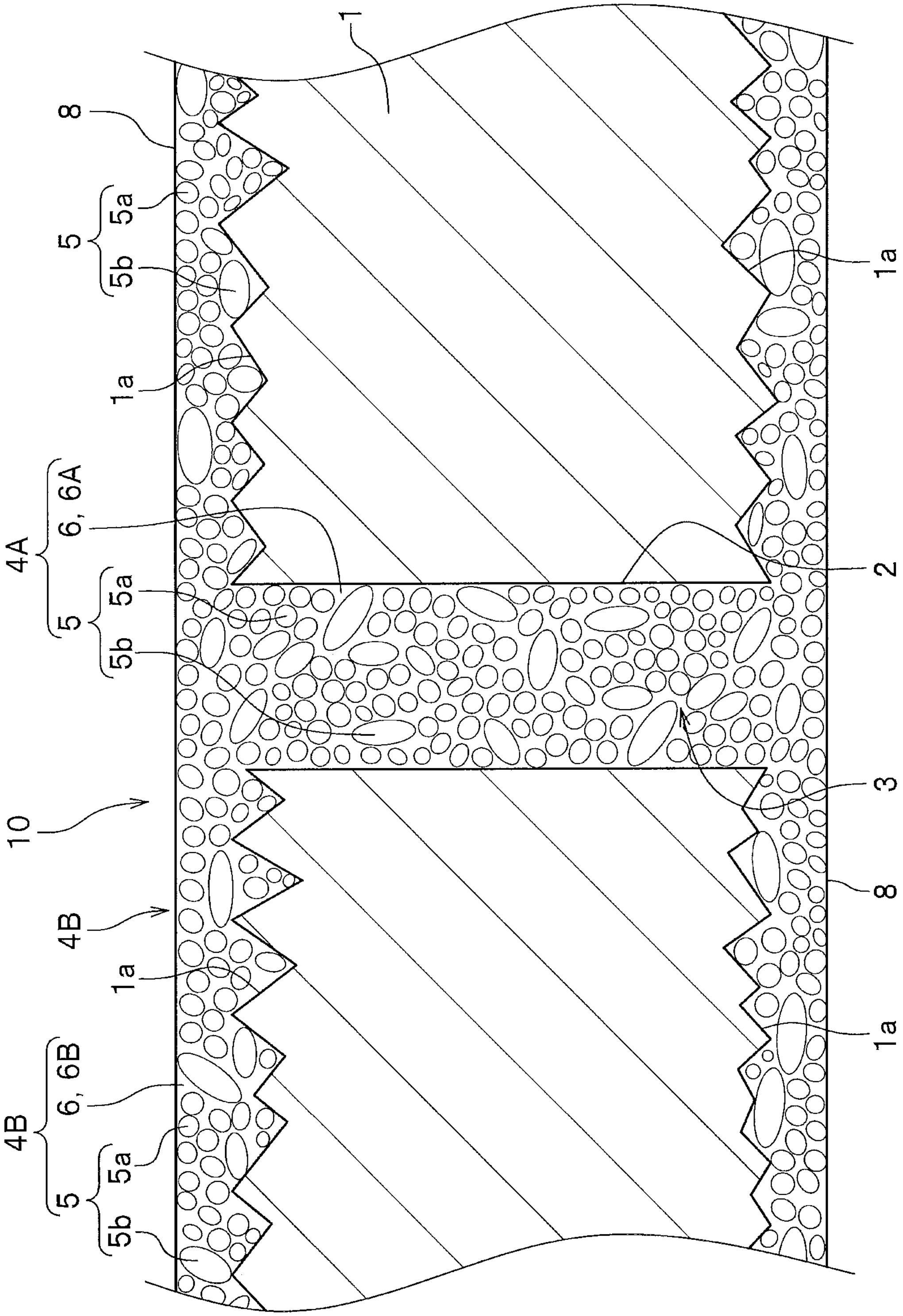
FIG. 11 is an enlarged cross-sectional view schematically illustrating an enlarged part of another configuration of the wiring substrate according to the embodiment.

Even when the weight proportion of the small-sized particles 5*a* to the small-sized particles 5*a* and the large-sized particles 5*b* of the copper particles 5 of the first conductive member 4A in the conductive portion 3 is in a range from 30 wt. % to 50 wt. % and the weight proportion of the small-sized particles 5*a* to the small-sized particles 5*a* and the large-sized particles 5*b* of the copper particles 5 of the second conductive member 4B in the wiring portion 8 is 70 wt. % as illustrated in FIG. 11, a decrease in the amount of volumetric shrinkage can be reduced in the conductive portion 3 compared with that in the conventional conductive portion. That is, regarding the weight proportions of the small-sized particles 5*a* and the large-sized particles 5*b* of the copper particles 5 in the conductive portion 3 in the conventional configuration, the proportion of the particle size of the copper particles 5 is not studied also in consideration of the portion overlapping with the wiring portion 8. Therefore, even in the configuration as illustrated in FIG. 11, the amount of volumetric shrinkage can be sufficiently reduced compared with that of the conventional conductive portion, and the effect of the present invention can be exhibited.

The invention claimed is:

1. A wiring substrate comprising:

a base body provided with a via hole;

a conductive portion disposed in the via hole; and a wiring portion electrically connected to the conductive portion and disposed on a surface of the base body, wherein the conductive portion includes a first conductive member containing copper particles and a first resin, and the first conductive member contains small-sized particles with a particle size in a range from 0.1 μm to 1.0 μm and large-sized particles with a particle size in a range from more than 1.0 μm to 10 μm, the wiring portion includes a second conductive member containing copper particles, and the second conductive member contains small-sized particles with a particle size in a range from 0.1 μm to 1.0 μm and large-sized particles with a particle size in a range from more than 1.0 μm to 10 μm, and a weight proportion of the small-sized particles in the first conductive member is lower than a weight proportion of the small-sized particles in the second conductive member.

2. The wiring substrate according to claim 1, wherein the weight proportion of the small-sized particles contained in the second conductive member to a total of the small-sized particles and the large-sized particles contained in the second conductive member is in a range from 70 wt. % to 95 wt. %.

3. The wiring substrate according to claim 1, wherein the weight proportion of the small-sized particles contained in the first conductive member to a total of the small-sized particles and the large-sized particles contained in the first conductive member is in a range from 30 wt. % to less than 70 wt. %.

4. The wiring substrate according to claim 1, wherein the first conductive member and the second conductive member are continuous without an interface between the first conductive member and the second conductive member.

5. The wiring substrate according to claim 1, wherein a content of the first resin in the first conductive member is in a range from 0.1 parts by mass to 2 parts by mass per 100 parts by mass of the copper particles contained in the first conductive member.

6. The wiring substrate according to claim 1, wherein the second conductive member further contains a second resin, and a content of the second resin is in a range from 0.25 parts by mass to 3 parts by mass per 100 parts by mass of the copper particles contained in the second conductive member.

7. The wiring substrate according to claim 1, wherein the base body is at least one of glass epoxy resin, polyolefin resin, polyimide resin, aluminum nitride, or silicon nitride.

8. The wiring substrate according to claim 1, wherein the surface of the base body is a rough surface and has a maximum height roughness of 1.0 μm or more.

9. A light-emitting device comprising:

the wiring substrate according to claim 1; and a light-emitting element electrically connected to the wiring portion of the wiring substrate.

10. The light-emitting device according to claim 9, further comprising:

a light-reflecting member spaced apart from a lateral surface of the light-emitting element; and a sealing member disposed between the light-reflecting member and the lateral surface of the light-emitting element so as to cover an upper surface of the light-emitting element.

* * * * *